(12) United States Patent
Osajima et al.

(10) Patent No.: US 8,513,567 B2
(45) Date of Patent: Aug. 20, 2013

(54) LASER PROCESSING METHOD FOR FORMING A MODIFIED REGION FOR CUTTING IN AN OBJECT

(75) Inventors: Tetsuya Osajima, Shizuoka (JP); Ryuji Sugiura, Shizuoka (JP); Kazuhiro Atsumi, Shizuoka (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 1392 days.

(21) Appl. No.: 12/064,275

(22) PCT Filed: Sep. 13, 2006

(86) PCT No.: PCT/JP2006/318163
§ 371 (c)(1),
(2), (4) Date: Feb. 20, 2008

(87) PCT Pub. No.: WO2007/032392
PCT Pub. Date: Mar. 22, 2007

(65) Prior Publication Data
US 2009/0261083 A1 Oct. 22, 2009

(30) Foreign Application Priority Data
Sep. 16, 2005 (JP) ................................ P2005-270817

(51) Int. Cl.
*B23K 26/38* (2006.01)
*B23K 26/073* (2006.01)
(52) U.S. Cl.
USPC ................................................... 219/121.72
(58) Field of Classification Search
USPC ............... 219/121.67, 121.72, 121.6, 121.68, 219/121.69, 121.73; 438/463; 225/2
See application file for complete search history.

(56) References Cited

U.S. PATENT DOCUMENTS 5,229,569 A * 7/1993 Miyauchi et al. .......... 219/121.6
5,776,220 A * 7/1998 Allaire et al. ............. 219/121.6
(Continued)

FOREIGN PATENT DOCUMENTS

DE 4305107 A1 * 2/1993
EP 1 338 371 8/2003
(Continued)

OTHER PUBLICATIONS

K. Hayashi; "Inner Glass Marking by Harmonics of Solid-State Laser", Proceedings of 45$^{th}$ Laser Materials Processing Conference, Dec. 1998, pp. 23-28.
(Continued)

*Primary Examiner* — Geoffrey S Evans
(74) *Attorney, Agent, or Firm* — Drinker Biddle & Reath LLP

(57) ABSTRACT

In the laser processing method, the cross-sectional form of laser light L at a converging point P is such that the maximum length in a direction perpendicular to a line to cut 5 is shorter than the maximum length in a direction parallel to the line to cut 5. Therefore, when seen from the incident direction of the laser light L, a modified region 7 formed within a silicon wafer 11 has such a shape that the maximum length in the direction perpendicular to the line to cut 5 is shorter than the maximum length in the direction parallel to the line to cut 5. Forming the modified region 7 having such a shape within the object 1 can restrain twist hackles from occurring on cut surfaces when cutting the object 1 from the modified region 7 acting as a cutting start point, thereby making it possible to improve the flatness of the cut surfaces.

11 Claims, 20 Drawing Sheets

(56) References Cited

U.S. PATENT DOCUMENTS

| | | | |
|---|---|---|---|
| 6,211,488 B1 | 4/2001 | Hoekstra et al. | |
| 6,992,026 B2 | 1/2006 | Fukuyo et al. | |
| 7,396,742 B2 | 7/2008 | Fukuyo et al. | |
| 7,489,454 B2 | 2/2009 | Fukuyo et al. | |
| 7,547,613 B2 | 6/2009 | Fukuyo et al. | |
| 7,566,635 B2 | 7/2009 | Fujii et al. | |
| 7,592,237 B2 | 9/2009 | Sakamoto et al. | |
| 7,592,238 B2 | 9/2009 | Fukuyo et al. | |
| 7,605,344 B2 | 10/2009 | Fukumitsu | |
| 7,608,214 B2 | 10/2009 | Kuno et al. | |
| 7,615,721 B2 | 11/2009 | Fukuyo et al. | |
| 7,626,137 B2 | 12/2009 | Fukuyo et al. | |
| 7,709,767 B2 | 5/2010 | Sakamoto | |
| 7,718,510 B2 | 5/2010 | Sakamoto et al. | |
| 7,719,017 B2 | 5/2010 | Tanaka | |
| 7,732,730 B2 | 6/2010 | Fukuyo et al. | |
| 7,749,867 B2 | 7/2010 | Fukuyo et al. | |
| 7,754,583 B2 | 7/2010 | Sakamoto | |
| 7,825,350 B2 | 11/2010 | Fukuyo et al. | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 7,947,574 B2 | 5/2011 | Sakamoto et al. | |
| 2002/0170898 A1* | 11/2002 | Ehrmann et al. | 219/121.73 |
| 2004/0002199 A1* | 1/2004 | Fukuyo et al. | 438/463 |
| 2005/0173387 A1 | 8/2005 | Fukuyo et al. | |
| 2005/0202596 A1 | 9/2005 | Fukuyo et al. | |
| 2005/0272223 A1 | 12/2005 | Fujii et al. | |
| 2006/0144828 A1 | 7/2006 | Fukumitsu et al. | |
| 2006/0148212 A1 | 7/2006 | Fukuyo et al. | |
| 2006/0255024 A1 | 11/2006 | Fukuyo et al. | |
| 2007/0085099 A1 | 4/2007 | Fukumitsu et al. | |
| 2007/0125757 A1 | 6/2007 | Fukuyo et al. | |
| 2007/0158314 A1 | 7/2007 | Fukumitsu et al. | |
| 2007/0252154 A1 | 11/2007 | Uchiyama et al. | |
| 2008/0035611 A1 | 2/2008 | Kuno et al. | |
| 2008/0037003 A1 | 2/2008 | Atsumi et al. | |
| 2008/0090382 A1 | 4/2008 | Fujii et al. | |
| 2008/0218735 A1 | 9/2008 | Atsumi et al. | |
| 2008/0251506 A1 | 10/2008 | Atsumi et al. | |
| 2009/0008373 A1 | 1/2009 | Muramatsu et al. | |
| 2009/0032509 A1 | 2/2009 | Kuno et al. | |
| 2009/0098713 A1 | 4/2009 | Sakamoto | |
| 2009/0107967 A1 | 4/2009 | Sakamoto et al. | |
| 2009/0117712 A1 | 5/2009 | Sakamoto et al. | |
| 2009/0166342 A1 | 7/2009 | Kuno et al. | |
| 2009/0166808 A1 | 7/2009 | Sakamoto et al. | |
| 2009/0250446 A1 | 10/2009 | Sakamoto | |
| 2009/0302428 A1 | 12/2009 | Sakamoto et al. | |
| 2010/0006548 A1 | 1/2010 | Atsumi et al. | |
| 2010/0009547 A1 | 1/2010 | Sakamoto | |
| 2010/0012632 A1 | 1/2010 | Sakamoto | |
| 2010/0012633 A1 | 1/2010 | Atsumi et al. | |
| 2010/0015783 A1 | 1/2010 | Fukuyo et al. | |
| 2010/0025386 A1 | 2/2010 | Kuno et al. | |
| 2010/0032418 A1 | 2/2010 | Kuno et al. | |
| 2010/0055876 A1 | 3/2010 | Fukuyo et al. | |
| 2010/0151202 A1 | 6/2010 | Fukumitsu | |
| 2010/0176100 A1 | 7/2010 | Fukuyo et al. | |
| 2010/0184271 A1 | 7/2010 | Sugiura et al. | |
| 2010/0200550 A1 | 8/2010 | Kumagai | |
| 2010/0203678 A1 | 8/2010 | Fukumitsu et al. | |
| 2010/0203707 A1 | 8/2010 | Fujii et al. | |
| 2010/0227453 A1 | 9/2010 | Sakamoto | |
| 2010/0240159 A1 | 9/2010 | Kumagai et al. | |
| 2010/0258539 A1 | 10/2010 | Sakamoto | |
| 2010/0301521 A1 | 12/2010 | Uchiyama | |
| 2010/0311313 A1 | 12/2010 | Uchiyama | |
| 2010/0327416 A1 | 12/2010 | Fukumitsu | |
| 2011/0000897 A1 | 1/2011 | Nakano et al. | |
| 2011/0001220 A1 | 1/2011 | Sugiura et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2011/0274128 A1 | 11/2011 | Fukumitsu et al. | |

FOREIGN PATENT DOCUMENTS

| | | | |
|---|---|---|---|
| JP | 3-133590 A | * | 6/1991 |
| JP | 4-295851 A | * | 10/1992 |
| JP | 8-1363 | | 1/1996 |
| JP | 9-150286 | | 6/1997 |
| JP | 10-258385 A | * | 9/1998 |
| JP | 3044811 B2 | | 5/2000 |
| JP | 2000-263257 | | 9/2000 |
| JP | 2002-324768 | | 11/2002 |
| JP | 2003-266185 | | 9/2003 |
| JP | 2004-179302 | | 6/2004 |
| JP | 2004-188422 A | | 7/2004 |
| JP | 2005-116844 | | 4/2005 |
| JP | 2005-186100 A | * | 7/2005 |
| JP | 2005-235993 | | 9/2005 |
| TW | 200515966 | | 5/2005 |
| WO | WO-2005/102638 A1 | | 11/2005 |

OTHER PUBLICATIONS

K. Miura et al., "Formation of Photo-Induced Structures in Glasses with Femtosecond Laser", Proceedings of 42$^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner

LASER PROCESSING METHOD FOR FORMING A MODIFIED REGION FOR CUTTING IN AN OBJECT

TECHNICAL FIELD

The present invention relates to a laser processing method and a laser processing apparatus which are used for cutting an object to be processed along a line to cut.

BACKGROUND ART

Known as a conventional laser processing method of this kind is one which irradiates an object to be processed with laser light while locating a converging point within the object, so as to form a modified region to become a cutting start point within the object along a line to cut (see, for example, Patent Document 1).

Patent Document 1: Japanese Patent Application Laid-Open No. 2004-179302

DISCLOSURE OF THE INVENTION

Problem to be Solved by the Invention

When an object to be processed is cut from a modified region acting as a cutting start point by using a laser processing method such as the one mentioned above, however, twist hackles may occur on cut surfaces, thus causing undulations and irregularities thereon and so forth, thereby deteriorating the flatness of the cut surfaces.

In view of such circumstances, it is an object of the present invention to provide a laser processing method and a laser processing apparatus which can improve the flatness of cut surfaces when cutting an object to be processed from a modified region acting as a cutting start point.

Means for Solving Problem

For achieving the above-mentioned object, the laser processing method in accordance with the present invention is a laser processing method of forming a modified region to become a cutting start point within an object to be processed along a line to cut the object by irradiating the object with laser light while locating a converging point within the object, wherein a predetermined modified region is formed by irradiation with predetermined laser light whose cross-sectional form at the converging point is such that the maximum length in a direction perpendicular to the line to cut is shorter than the maximum length in a direction parallel to the line to cut.

In this laser processing method, the cross-sectional form (perpendicular to the optical axis) of predetermined laser light at the converging point is such that the maximum length in a direction perpendicular to the line to cut is shorter than the maximum length in a direction parallel to the line to cut. Therefore, when seen from the incident direction of the laser light, the shape of the predetermined modified region formed within the object is such that the maximum length perpendicular to the line to cut is shorter than the maximum length parallel to the line to cut. Forming a predetermined modified region having such a shape within the object can restrain twist hackles from occurring on cut surfaces when cutting the object from the modified region acting as a cutting start point, thereby making it possible to improve the flatness of the cut surfaces.

The modified region to become a starting point region for cutting is formed by causing optical absorption such as multiphoton absorption within the object by irradiating the object with laser light while locating a converging point within the object.

Preferably, in the laser processing method in accordance with the present invention, a fracture extending along the line to cut is generated in a laser light incident surface of the object from a predetermined modified region by forming the predetermined modified region. Since the form of the predetermined modified region is such that the maximum length in the direction perpendicular to the line to cut is shorter than the maximum length in the direction parallel to the line to cut as seen from the incident direction of the laser light as mentioned above, twist hackles are restrained from occurring in the fracture generated in the laser light incident surface of the object from the predetermined modified region. This can hinder the fracture from meandering and cranking and advance the fracture substantially straight forward, thus making it possible to improve the flatness of cut surfaces when cutting the object from the modified region acting as a cutting start point. When relatively thin, the object can reliably be cut from the modified region acting as a cutting start point if a fracture extending along the line to cut is generated in the laser light incident surface of the object from the predetermined modified region.

Preferably, after forming the modified region within the object, the object is cut along the line to cut in the laser processing method in accordance with the present invention. This makes it possible to cut the object accurately along the line to cut.

The laser processing method in accordance with the present invention encompasses a case where the object is provided with a semiconductor substrate, while the modified region includes a molten processed region.

Effect of the Invention

The present invention can improve the flatness of cut surfaces when cutting an object to be processed from a modified region acting as a starting point region for cutting.

EXPLANATIONS OF NUMERALS OR LETTERS

1 . . . object to be processed; 3 . . . front face (laser light incident surface); 5 . . . line to cut; 7 . . . modified region; 11 . . . silicon wafer (semiconductor substrate); 13 . . . molten processed region; 24 . . . fracture; 50 . . . laser processing apparatus; 52 . . . laser head (laser light source); 55 . . . knife edge (changing means); 56 . . . objective lens (condenser lens); L . . . laser light; P . . . converging point.

Best Modes for Carrying out the Invention

In the following, preferred embodiments of the present invention will be explained in detail with reference to the drawings. In the laser processing methods in accordance with the embodiments, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point, and the multiphoton absorption occurs under a condition where the peak power density is 1×10$^8$ (W/cm$^2$) or greater, for example. The peak power density is determined by (energy of laser light at the converging point per pulse)/ (beam spot cross-sectional area of laser light×pulse width). In the case of continuous waves, the intensity of laser light is determined by the field intensity (W/cm$^2$) of laser light at the converging point.

Figure 1:
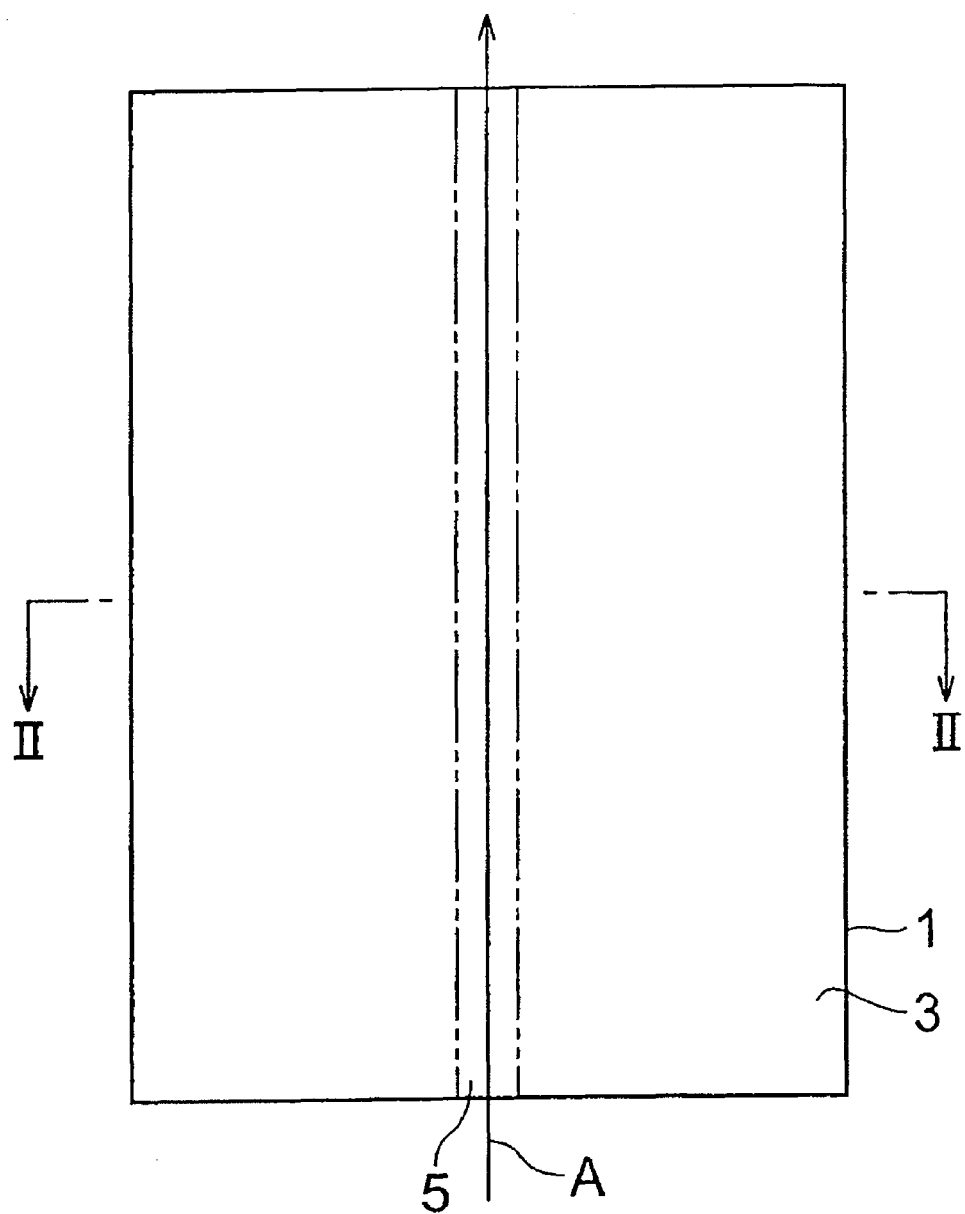
FIG. 1 is a plan view of an object to be processed during laser processing by the laser processing method in accordance with an embodiment.
Figure 2:
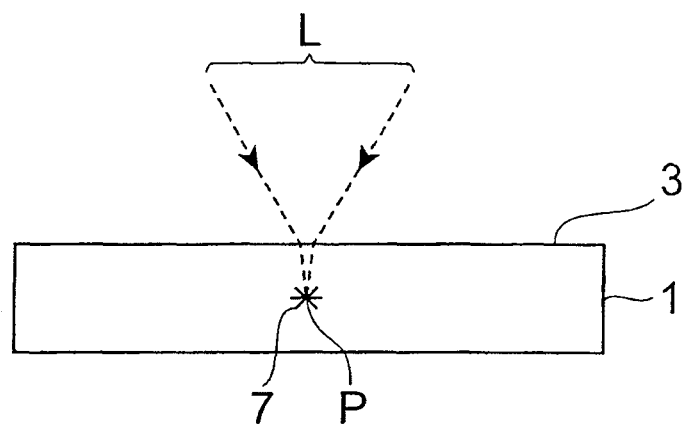
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P within the object 1 under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
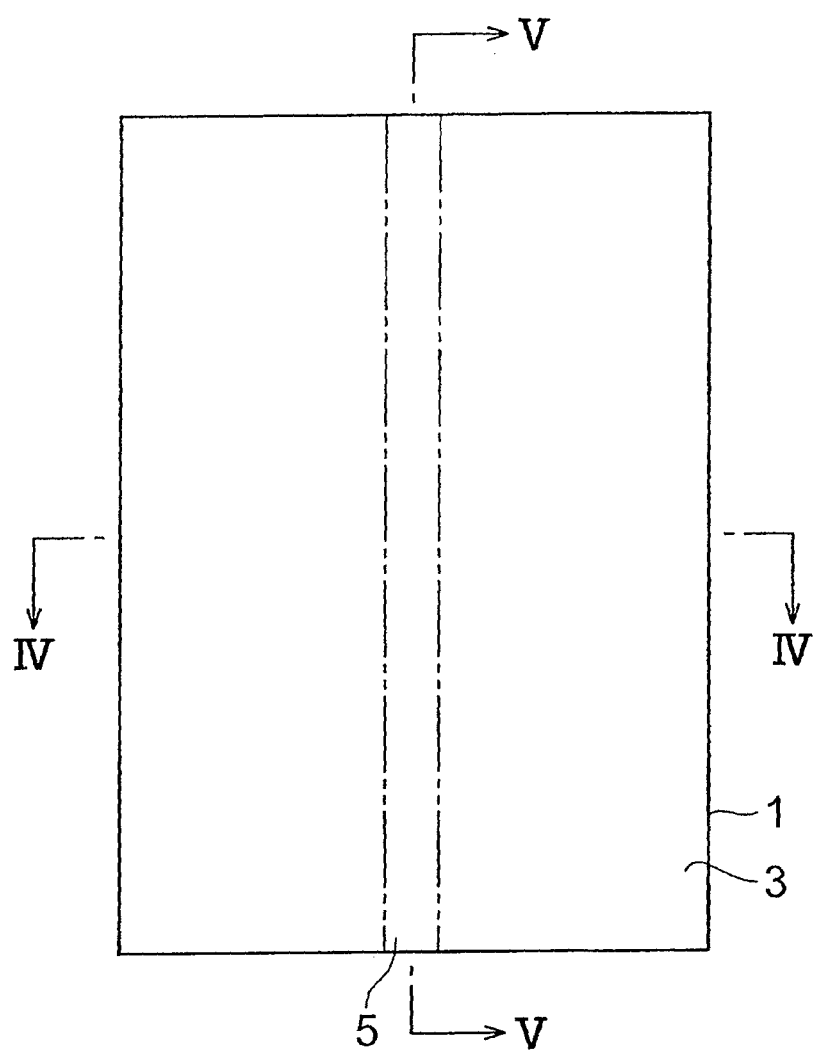
FIG. 3 is a plan view of the object after the laser processing by the laser processing method in accordance with the embodiment.
Figure 4:
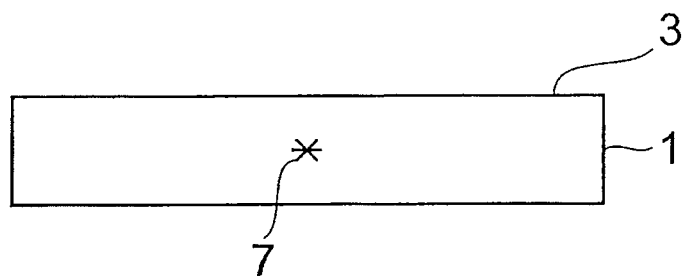
FIG. 4 is a sectional view of the object taken along the line IV-IV of FIG. 3.
Figure 5:
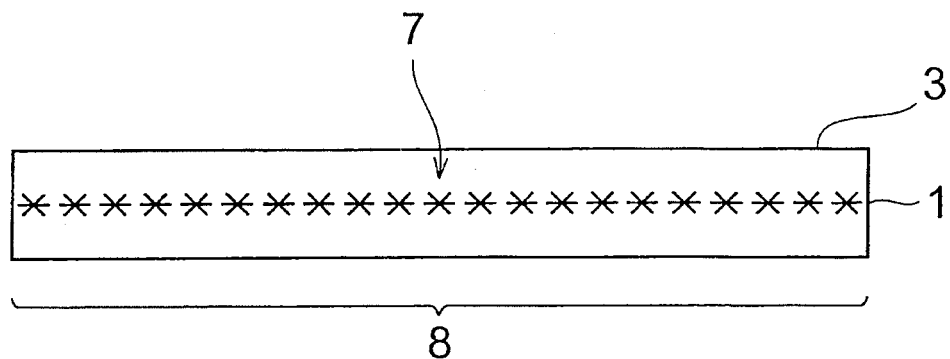
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1 and becomes a starting point region for cutting 8. Here, the starting point region for cutting 8 refers to a region which becomes a start point for cutting (fracturing) when the object 1 is cut. The starting point region for cutting 8 may be made by forming the modified region 7 either continuously or intermittently.

The laser processing method in accordance with this embodiment is not one in which the object 1 absorbs the laser light L, thereby heating the object 1 and forming the modified region 7. The laser light L is transmitted through the object 1, so as to generate multiphoton absorption within the object 1, thereby forming the modified region 7. Therefore, the front face 3 of the object 1 hardly absorbs the laser light L and thus does not melt.

Figure 6:
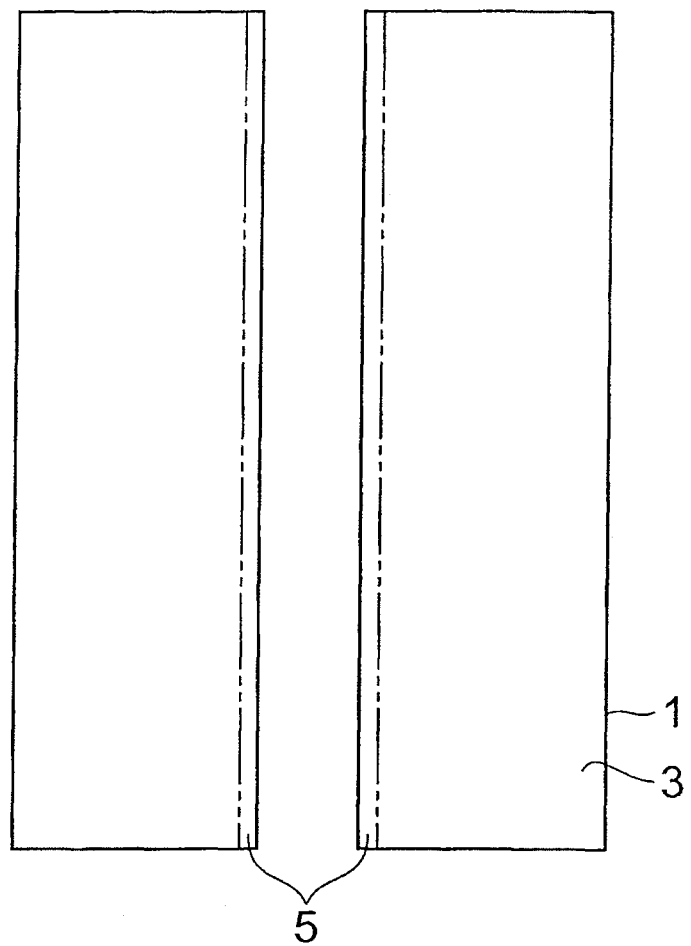
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress on the object 1 along the starting point region for cutting 8 thereof, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 such as silicon wafer has recently been apt to decrease its thickness.

The modified region formed by multiphoton absorption in the laser processing method in accordance with this embodiment encompasses the following cases (1) to (3):

(1) Case where the modified region is a crack region including one crack or a plurality of cracks An object to be processed (e.g., glass or a piezoelectric material made of $LiTaO_3$) is irradiated with laser light while locating a converging point therewithin under a condition with a field intensity of at least $1\times10^8$ (W/cm$^2$) at the converging point and a pulse width of 1 μs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1\times10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)

(B) Laser
light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: output<1 mJ/pulse
laser light quality: $TEM_{00}$
polarizing property: linear polarization (C) Condenser lens
transmittance at a laser light wavelength: 60%

(D) Moving rate of the mount table mounting the object: 100 mm/sec

The laser light quality of $TEM_{00}$ means that the converging characteristic is so high that convergence to about the wavelength of laser light is possible.

Figure 7:
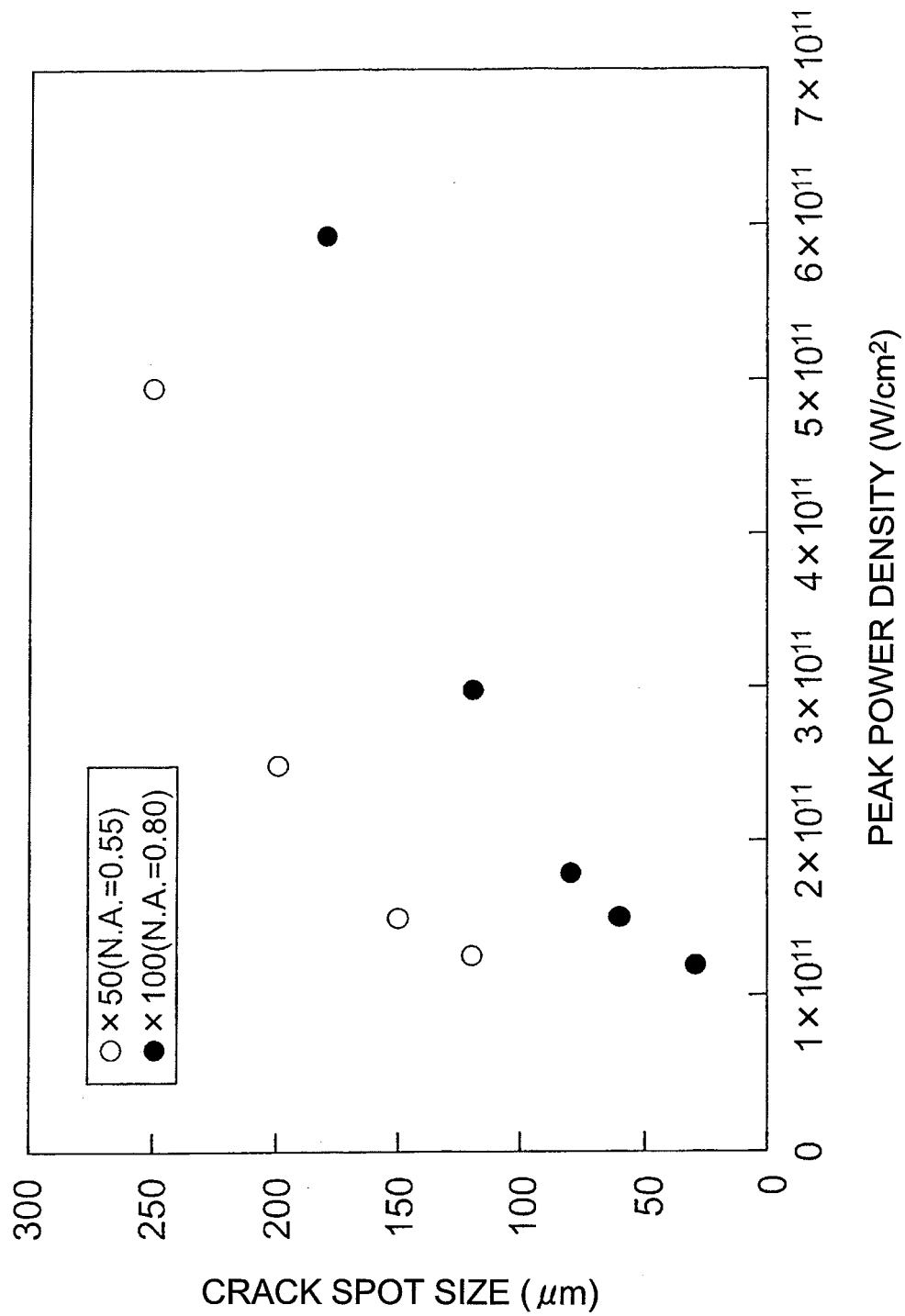
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
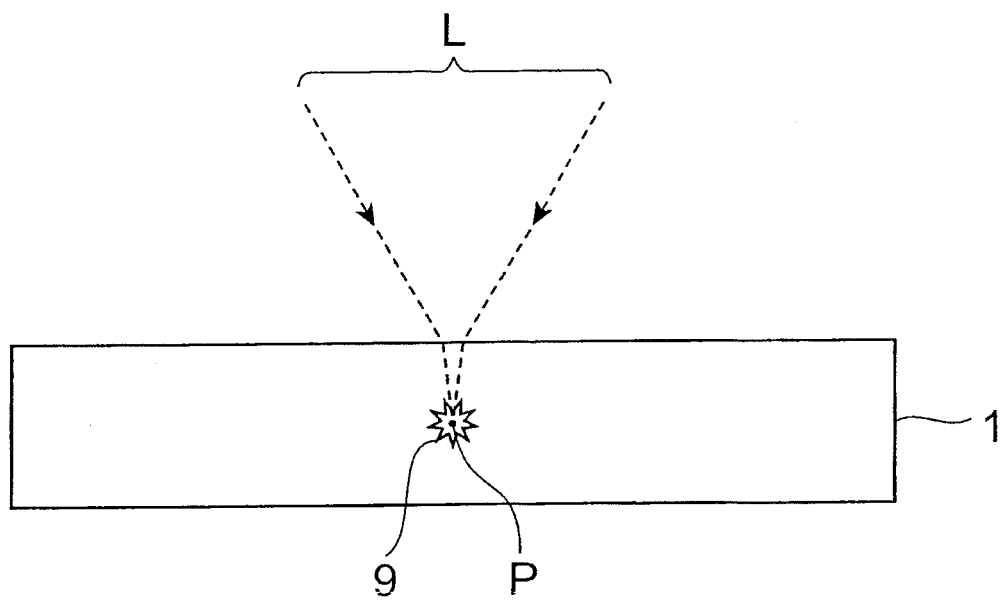
FIG. 8 is a sectional view of the object in a first step of the laser processing method in accordance with the embodiment.
Figure 9:
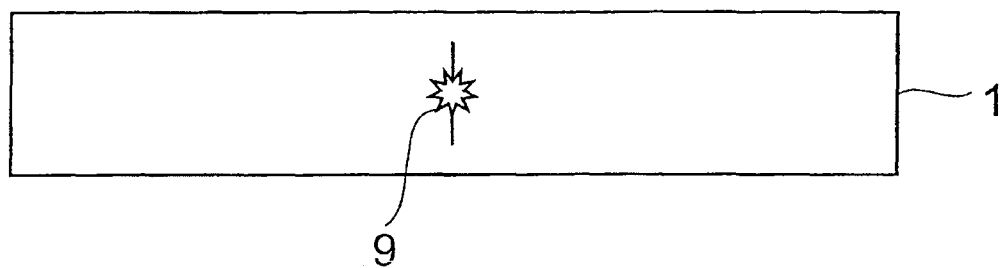
FIG. 9 is a sectional view of the object in a second step of the laser processing method in accordance with the embodiment.
Figure 10:
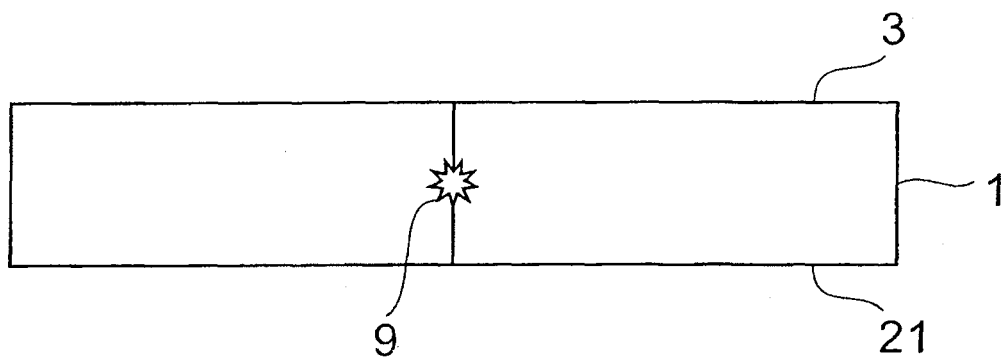
FIG. 10 is a sectional view of the object in a third step of the laser processing method in accordance with the embodiment.
Figure 11:
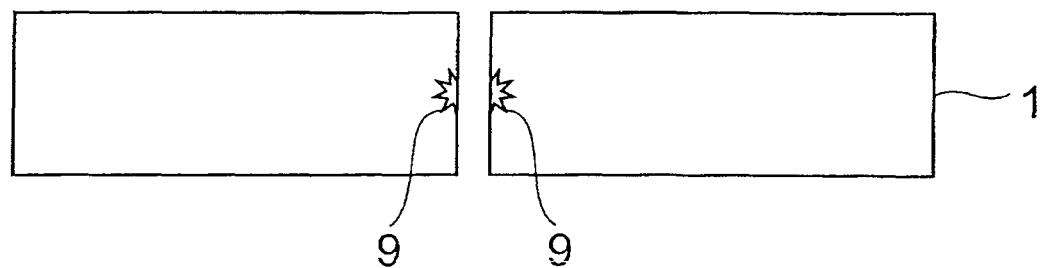
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the modified region is a molten processed region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer (semiconductor substrate). The following are conditions of the experiment.

(A) Object to be processed: silicon wafer (with a thickness of 350 μm and an outer diameter of 4 inches)

Figure 12:
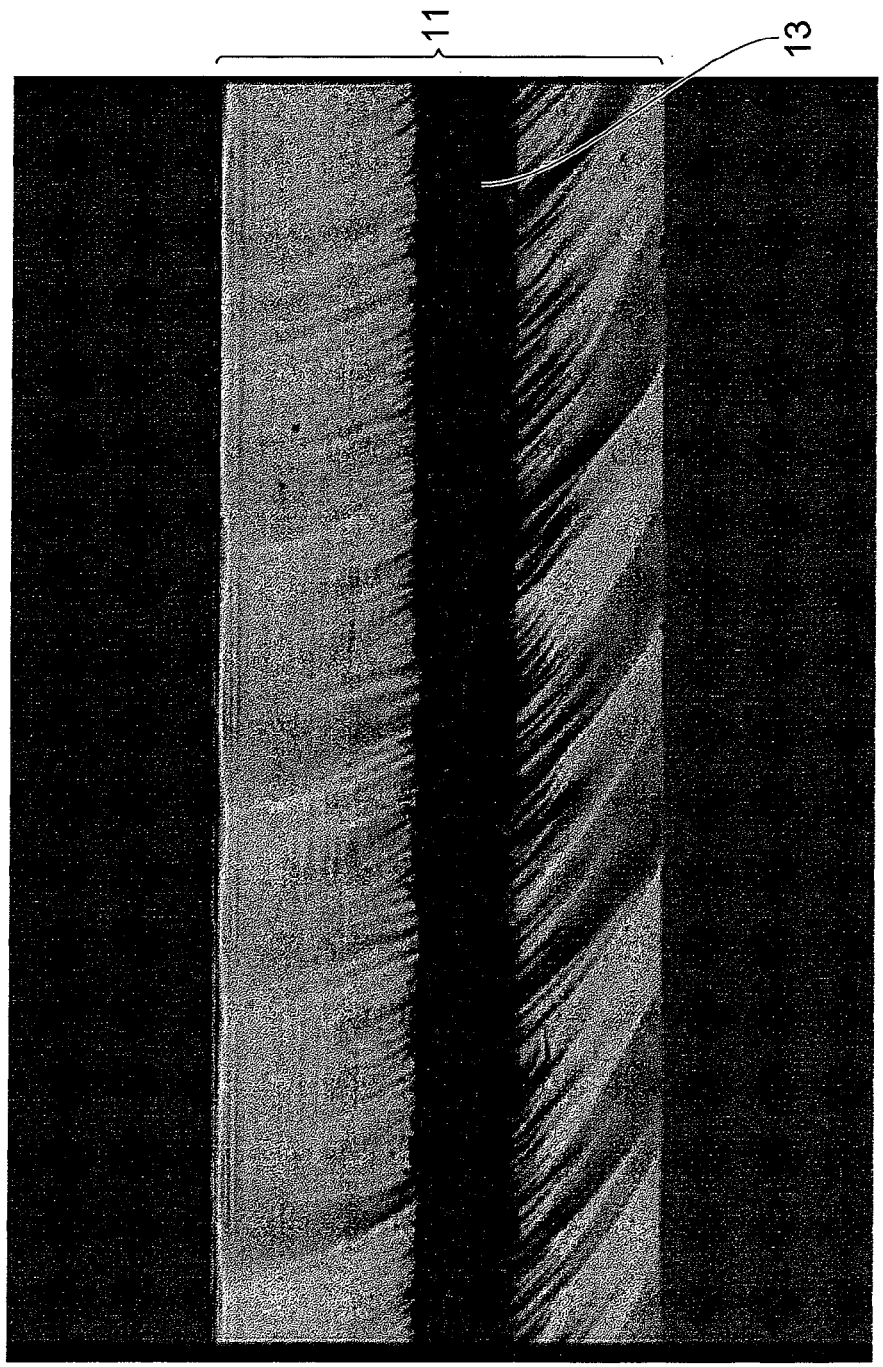
FIG. 12 is a view showing a photograph of a cut section in a part of a silicon wafer cut by the laser processing method in accordance with the embodiment.

(B) Laser
light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: 20 μJ/pulse laser light quality: TEM$_{00}$
polarizing property: linear polarization
(C) Condenser lens
magnification: ×50
N.A.: 0.55
transmittance at a laser light wavelength: 60%
(D) Moving rate of the mount table mounting the object: 100 mm/sec FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
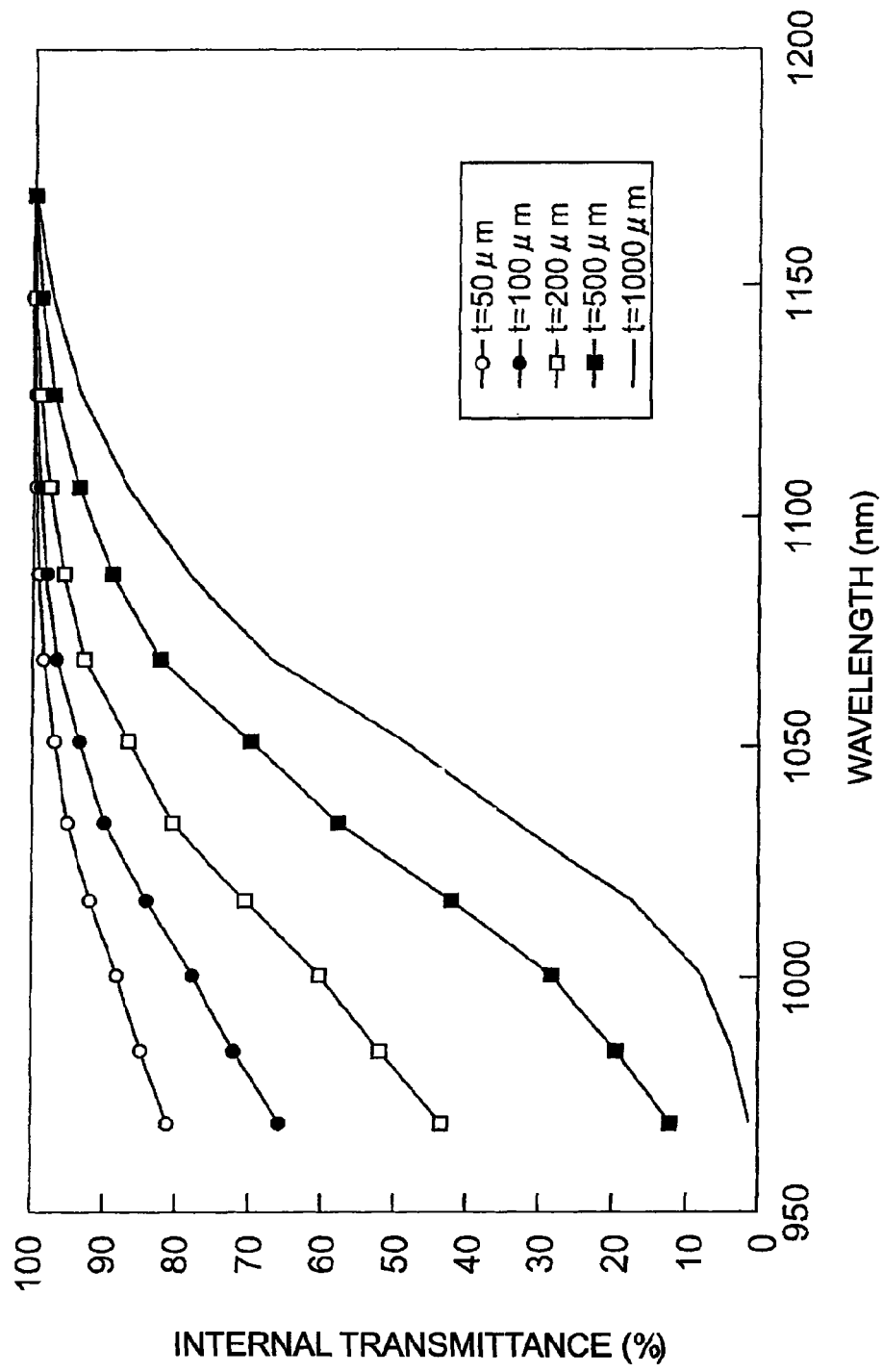
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier.

(3) Case where the modified region is a refractive index changed region

An object to be processed (e.g., glass) is irradiated with laser light while locating a converging point within the object under a condition with a field intensity of at least 1×10$^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is 1×10$^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (3) are explained in the foregoing as a modified region formed by multiphoton absorption. A starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately in the substrate with reference to the orientation flat.

Figure 14:
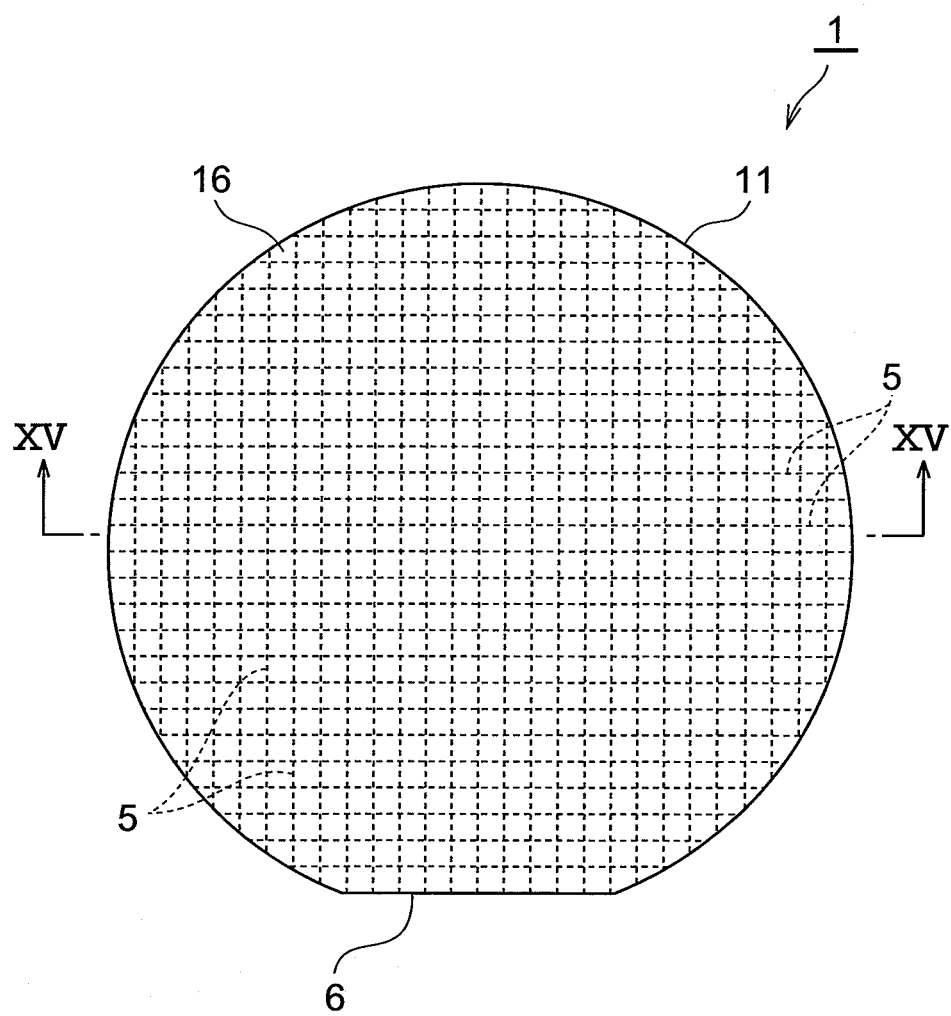
FIG. 14 is a plan view of the object in the laser processing method in accordance with the embodiment.

A preferred embodiment of the present invention will now be explained. FIG. 14 is a plan view of an object to be processed in the laser processing method in accordance with the embodiment, while FIG. 15 is a partial sectional view of the object taken along the line XV-XV of FIG. 14.

Figure 15:
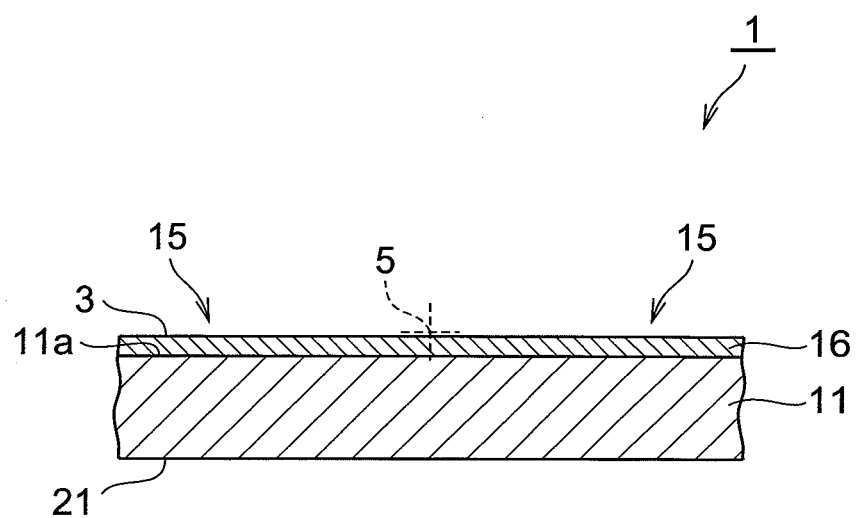
FIG. 15 is a partial sectional view of the object taken along the line XV-XV of FIG. 14.

As shown in FIGS. 14 and 15, an object to be processed 1 comprises a silicon wafer (semiconductor substrate) 11 having a thickness of 50 μm, and a functional device layer 16 which is formed on the front face 11a of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11.

Figure 16:
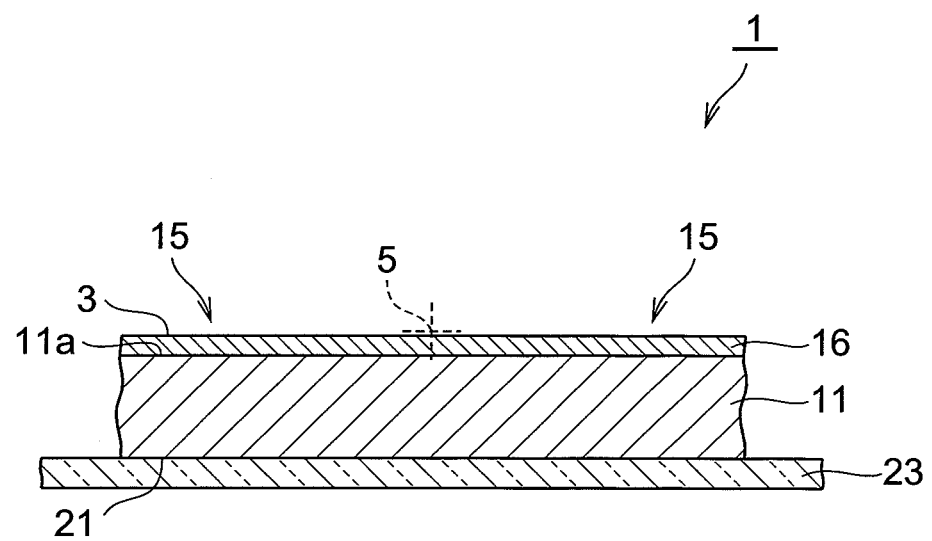
FIG. 16 is a partial sectional view showing a state where an expandable tape is attached to the rear face of the object shown in FIG. 14.
Figure 17:
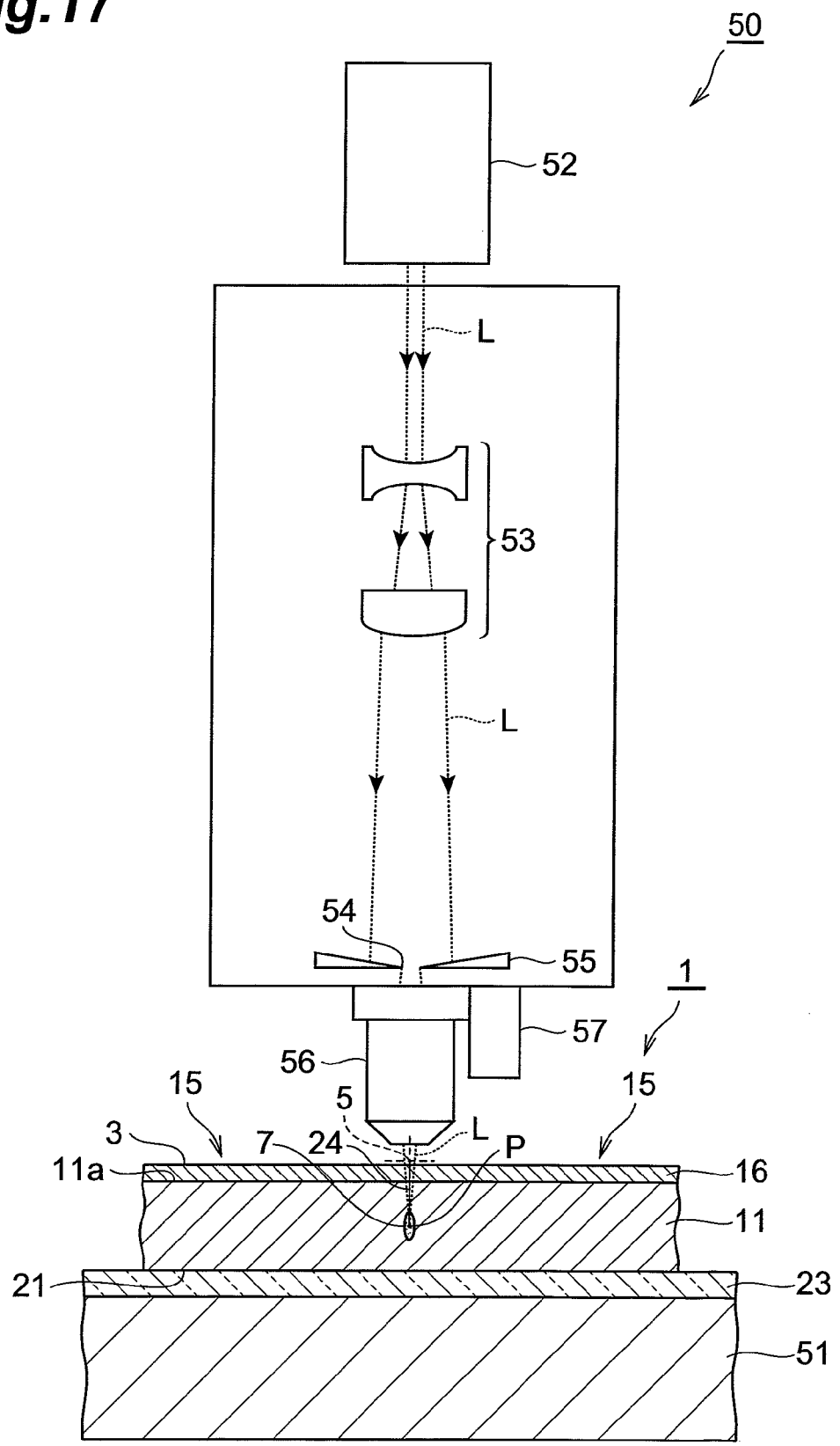
FIG. 17 is a partial sectional view showing a state where the object shown in FIG. 14 is irradiated with laser light.

Thus constructed object 1 is cut into the individual functional devices 15 in the following manner. First, as shown in FIG. 16, an expandable tape 23 is attached to the rear face 21 of the object 1. Subsequently, as shown in FIG. 17, the object 1 is fixed onto a mount table 51 of a laser processing apparatus 50 with the functional device layer 16 facing up. Then, the silicon wafer 11 is irradiated with laser light L under a condition generating multiphoton absorption while locating the converging point P within the silicon wafer 11, and the mount table is moved, so as to scan the converging point P along each of lines to cut 5 (see broken lines of FIG. 14) set like a grid passing between the functional devices 15, 15 adjacent to each other.

This forms one row of modified region 7 with respect to one line to cut 5 along the line to cut 5 and generates a fracture 24 along the line to cut 5 in the front face 3 of the object 1 from the modified region 7. The modified region 7 is a molten processed region, in which cracks may exist.

The laser processing apparatus 50 will now be explained. As shown in FIG. 17, the laser processing apparatus 50 comprises a laser head (laser light source) 52 for emitting the laser light L, a laser shaping optical system 53 for expanding the beam diameter of the emitted laser light L, and a pair of knife edges (changing means) 55 for forming a slit 54 which is positioned on the optical axis of the expanded laser light and extends in a direction parallel to the line to cut 5. The laser processing apparatus 50 further comprises an objective lens (condenser lens) 56 for converging the laser light L transmitted through the slit 54 and a piezoelectric device 57 for moving the objective lens 56 up and down in order to set the converging point to a position located at a constant depth from the front face 3 of the object 1. For example, the beam diameter of the laser light L expanded by the laser shaping optical system 53 is 5 mm, the width of the slit 54 is 1 mm, and the diameter of the entrance pupil of the objective lens 56 is 2.7 mm.

Figure 18:
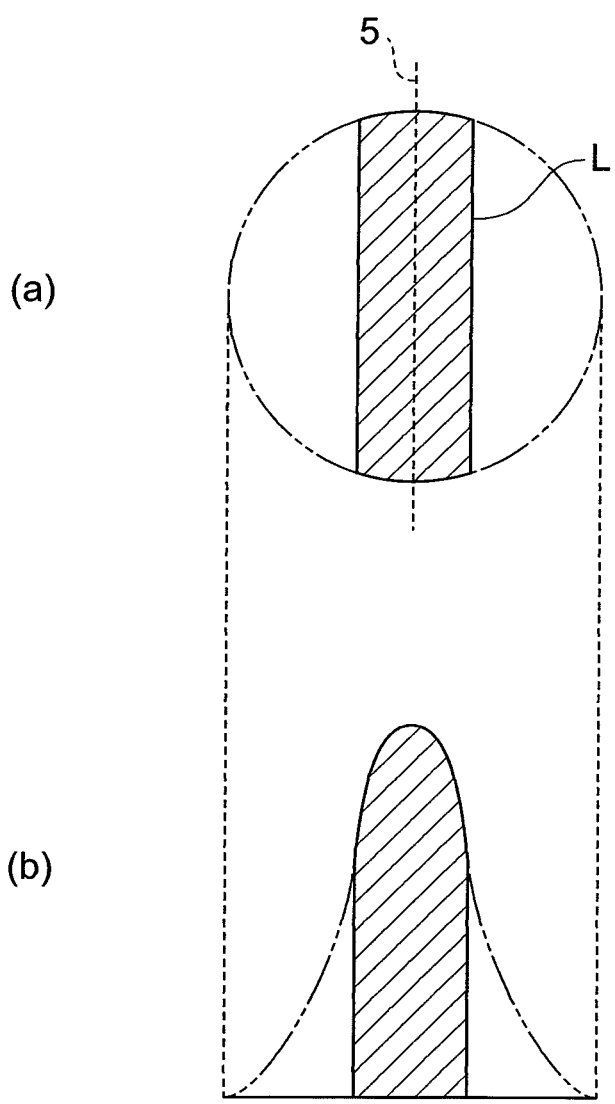
FIG. 18 is a view showing states of laser light at a converging point, in which (a) is a cross-sectional form of the laser light at the converging point, while (b) is an intensity distribution of the laser light at the converging point.

Consequently, the cross-sectional form (perpendicular to the optical axis) of the laser light L at the converging point P is such that the maximum length in the direction perpendicular to the line to cut 5 is shorter than the maximum length in the direction parallel to the line to cut 5 as shown in FIG. 18(a). The intensity distribution of the laser light L at the converging point P is such that both skirt parts of a Gaussian distribution are cut off in the direction perpendicular to the line to cut 5 as shown in FIG. 18(b). The knife edges 55 can advance and retract in horizontal directions with respect to the optical axis of the laser light L, so that changing the width of the slit 54 can alter the maximum length in the direction perpendicular to the line to cut 5.

Figure 19:
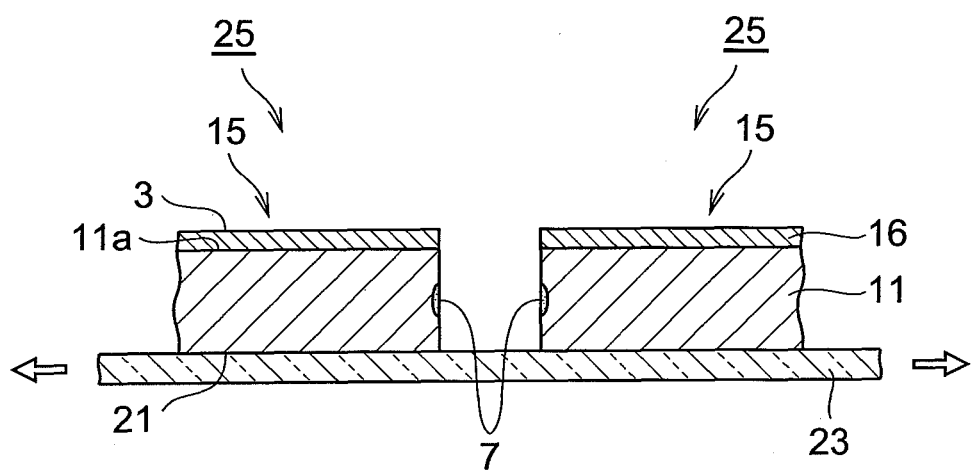
FIG. 19 is a partial sectional view showing a state where the expandable tape attached to the rear face of the object shown in FIG. 14 is expanded.

After forming the modified region 7 and generating the fracture 24, the expandable tape 23 is expanded as shown in FIG. 19, so that the fracture 24 also reaches the rear face 21 of the object 1 from the modified region 7 acting as a start point, thereby cutting the silicon wafer 11 and functional device layer 16 along the line to cut 5 and separating thus cut semiconductor chips 25 from each other.

In the above-mentioned laser processing method, the cross-sectional form of the laser light L at the converging point P is such that the maximum length in the direction perpendicular to the line to cut 5 is shorter than the maximum length in the direction parallel to the line to cut 5. Therefore, when seen from the incident direction of the laser light, the shape of the modified region 7 formed within the silicon wafer 11 is such that the maximum length in the direction perpendicular to the line to cut 5 is shorter than the maximum length in the direction parallel to the line to cut 5. Forming the modified region 7 having such a shape within the object 1 can restrain twist hackles from occurring on cut surfaces when cutting the object 1 from the modified region 7 acting as a cutting start point, thereby making it possible to improve the flatness of the cut surfaces.

Since the form of the modified region 7 is such that the maximum length in the direction perpendicular to the line to cut 5 is shorter than the maximum length in the direction parallel to the line to cut 5 as seen from the incident direction of the laser light L as mentioned above, twist hackles are restrained from occurring in the fracture 24 generated in the front face 3 of the object 1 from the modified region 7. This can hinder the fracture 24 from meandering and cranking and advance the fracture 24 substantially straight forward, which also contributes to improving the flatness of cut surfaces when cutting the object 1 from the modified region 7 acting as a cutting start point.

When the thickness of the object 1 is relatively small, e.g., 50 μm, the object 1 can reliably be cut into the semiconductor chips 25 (i.e., without leaving uncut parts) from the modified region 7 acting as a cutting start point if the fracture 24 extending along the line to cut 5 is generated in the front face 3 of the object 1 from the modified region 7.

The laser light L has such a form that the maximum length in the direction perpendicular to the line to cut 5 is shorter than the maximum length in the direction parallel to the line to cut 5 on the front face 3 of the object 1 as well. Therefore, even when the functional devices 15 are susceptible to heat, the gap between the functional devices 15, 15 adjacent to each other can be narrowed, so that a greater number of semiconductor chips 25 can be obtained from the single object 1.

The present invention is not limited to the above-mentioned embodiment.

For example, the number of rows of modified regions 7 formed within the object 1 with respect to one line to cut 5 varies according to the thickness of the object 1 and the like, and thus is not limited to 1. The modified region 7 may also be formed such that the fracture 24 extending along the line to cut 5 is not generated in the front face 3 of the object 1 from the modified region 7.

When forming a plurality of rows of modified regions 7 with respect to one line to cut 5, all the modified regions 7 may be formed by irradiation with laser light L having such a cross-sectional form at the converging point P that the maximum length in the direction perpendicular to the line to cut 5 (hereinafter referred to as "vertical direction length") is shorter than the maximum length in the direction parallel to the line to cut 5 (hereinafter referred to as "parallel direction length"). However, the modified region 7 formed at a position deeper from the laser light incident surface of the object 1 may fail to have an appropriate dividing effect, since the energy of laser light L becomes lower than that in the modified region 7 formed at a shallower position under the influence of the converging ratio of laser light L within the object 1. It will therefore be desirable if laser light L having such a cross-sectional form that the vertical direction length is shorter than the parallel direction length is emitted when forming the modified region 7 at a position shallower from the laser light incident surface of the object 1, and laser light L having such a cross-sectional form that the vertical direction length is longer than that at the time of forming the modified region 7 at the shallower position is emitted when forming the modified region 7 at a deeper position.

Also, a plurality of rows of modified regions 7 may be formed with respect to one line to cut 5 such that at least one of the first and second rows of modified regions 7 from the laser light incident surface of the object 1 is formed by irradiation with laser light having such a cross-sectional form that the vertical direction length is shorter than the parallel direction length (hereinafter referred to as "shaped laser light"), and the remaining modified regions 7 are formed by irradiation with laser light having such a cross-sectional form that the vertical direction length and the parallel direction length are substantially equal to each other (hereinafter referred to as "unshaped laser light"). Thus forming at least one of the first and second rows of modified regions 7 from the laser light incident surface of the object 1 by the shaped laser light can improve the cutting quality of the laser light incident surface when cutting the object 1 from the modified region 7 acting as a cutting start point. The shaped laser light and unshaped laser light can be switched therebetween in the following manner in the above-mentioned laser processing apparatus 50. Namely, the knife edges 55 are advanced with respect to the optical axis of the laser light L, so as to narrow the width of the slit 54, thereby yielding the shaped laser light. On the other hand, the knife edges 55 are retracted with respect to the optical axis of the laser light L, so as to widen the width of the slit 54, thereby yielding the unshaped laser light.

Figure 20:
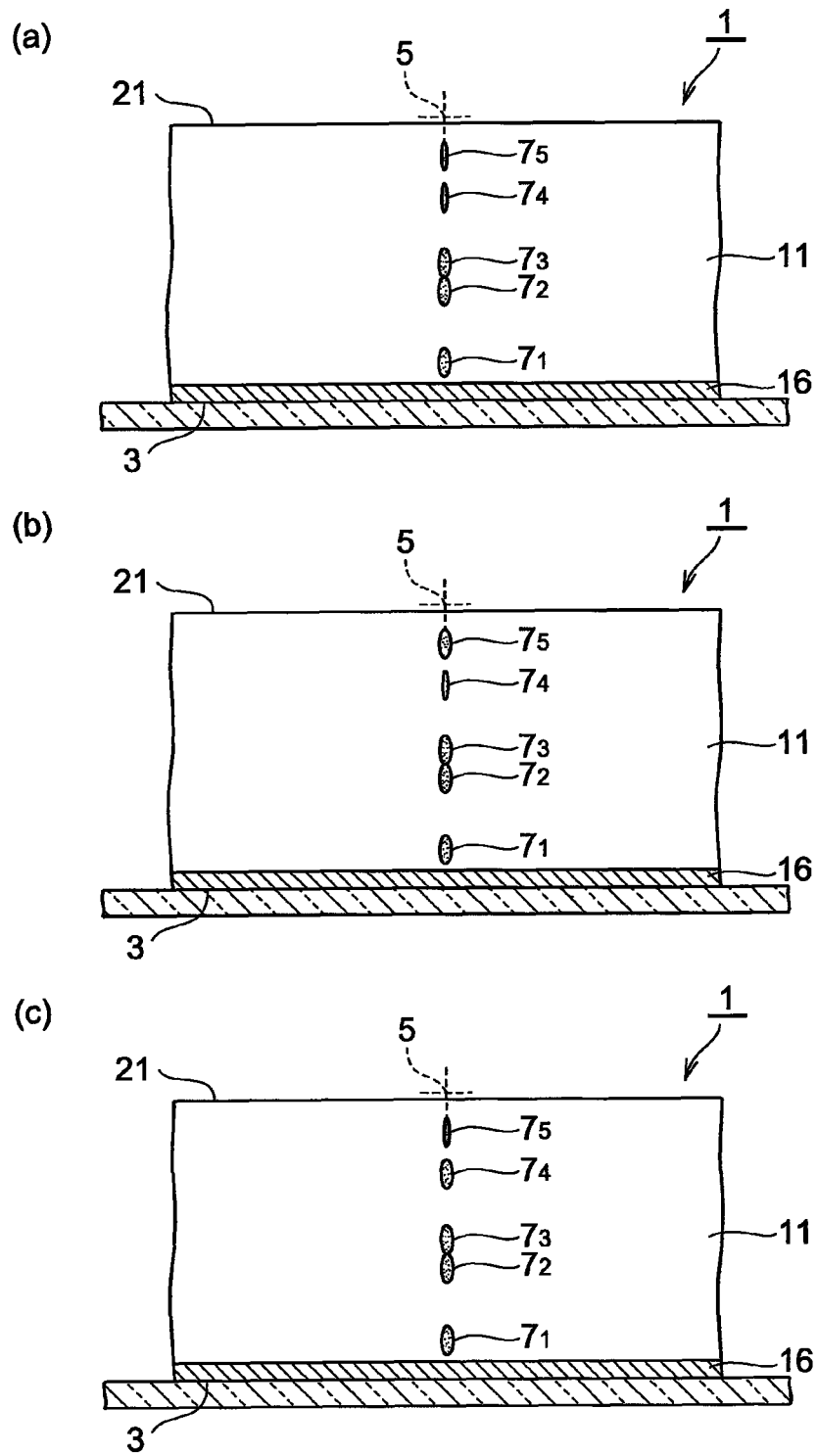
FIG. 20 is a partial sectional view of an object to be processed formed with five rows of modified regions with respect to one line to cut, in which (a) is a case where the first and second rows of modified regions from the rear face of the object are formed by irradiation with shaped laser light, while the remaining modified regions are formed by irradiation with unshaped laser light; (b) is a case where the second row of modified regions from the rear face of the object is formed by irradiation with the shaped laser light, while the remaining modified regions are formed by irradiation with the unshaped laser light; and (c) is a case where the first row of modified regions from the rear face of the object is formed by irradiation with the shaped laser light, while the remaining modified regions are formed by irradiation with the unshaped laser light.

FIG. 20 is a partial sectional view of an object to be processed 1 formed with five rows of modified regions $7_1$ to $7_5$ with respect to one line to cut 5, in which (a) is a case where the first and second rows of modified regions $7_4$, $7_5$ from the rear face 21 of the object 1 are formed by irradiation with the shaped laser light, while the remaining modified regions $7_1$ to $7_3$ are formed by irradiation with the unshaped laser light; (b) is a case where the second row of modified regions $7_4$ from the rear face 21 of the object 1 is formed by irradiation with the shaped laser light, while the remaining modified regions $7_1$ to $7_3$, $7_5$ are formed by irradiation with the unshaped laser light; and (c) is a case where the first row of modified regions $7_5$ from the rear face 21 of the object 1 is formed by irradiation with the shaped laser light, while the remaining modified regions $7_1$ to $7_4$ are formed by irradiation with the unshaped laser light. Though the case of FIG. 20(a) is effective in generating a deep fracture along the line to cut 5 in the rear face 21, and the case of FIG. 20(b) is effective in generating a shallow fracture along the line to cut 5 in the rear face 21, they are not always aimed at generating fractures.

Though the above-mentioned embodiments relate to a case where the front face 3 of the object 1 is the laser light incident surface, the rear face 21 of the object 1 may be employed as the laser light incident surface. Though the above-mentioned embodiments relate to a case where the functional device layer 16 is present on the line to cut 5, the front face 11a of the silicon wafer 11 may be employed as the laser light incident surface in a state where no functional device layer 16 is present on the line to cut 5 while exposing the front face 11a of the silicon wafer 11.

INDUSTRIAL APPLICABILITY

The present invention can improve the flatness of cut surfaces when cutting an object to be processed from a modified region acting as a starting point region for cutting.

The invention claimed is:

1. A laser processing method including forming a modified region to become a cutting start point within an object to be processed along a cutting line for cutting the object by irradiating the object with laser light while locating a converging point within the object, the method comprising:

forming a predetermined modified region formed by irradiation with predetermined laser light whose cross-sectional form at the converging point is such that the maximum length in a direction perpendicular to the cutting line is shorter than the maximum length in a direction parallel to the cutting line, and when forming a plurality of rows of the modified regions with respect to one cutting line, forming at least one of the first and second rows of the modified regions from the laser light incident surface of the object by irradiation with the predetermined laser light, and forming the remaining modified regions by irradiation with the laser light having a cross-sectional form at the converging point such that a maximum length in the direction perpendicular to the cutting line and a maximum length in the direction parallel to the cutting line are substantially equal to each other.

2. A laser processing method according to claim 1, wherein a fracture extending along the cutting line is generated in a laser light incident surface of the object from the predetermined modified region by forming the predetermined modified region.

3. A laser processing method according to claim 1, wherein, after forming the modified region within the object, the object is cut along the line from the modified region acting as a starting point region for cutting.

4. A laser processing method according to claim 1, wherein the object is provided with a semiconductor substrate, and wherein the modified region includes a molten processed region.

5. A laser processing method according to claim 1, wherein. the intensity distribution of the predetermined laser light at the converging point is such that both skirt parts of a Gaussian distribution are cut off in the direction perpendicular to the cutting line.

6. A laser processing apparatus for forming a modified region to become a cutting start point within an object to be processed along a cutting line for cutting the object by irradiating the object with laser light while locating a converging point within the object, the apparatus comprising:

a laser light source for emitting the laser light;

a condenser lens for converging the laser light emitted from the laser light source into the object; and changing means for changing the maximum length of a cross-sectional form of the laser light at the converging point in a direction perpendicular to the cutting line, wherein the changing means switches the predetermined laser light to have a maximum length of the cross-sectional form at the converging point in the direction perpendicular to the cutting line be shorter than a maximum length in the direction parallel to the cutting line, when the laser light has a maximum length of the cross-sectional form at the converging point in the direction perpendicular to the cutting line and has a maximum length in the direction parallel to the cutting line being substantially equal to each other, the predetermined laser light being switched by the changing means in accordance with the depth of the converging point from the laser light incident surface of the object.

7. A laser processing method including forming a modified region to become a cutting start point within an object to be processed along a cutting line for cutting the object by irradiating the object with laser light while locating a converging point within the object:

forming a predetermined modified region by irradiation with predetermined laser light whose maximum length of the cross-sectional form at the converging point in a direction perpendicular to the cutting line is shorter than the maximum length in a direction parallel to the cutting line, and when forming a plurality of rows of the modified regions with respect to one cutting line configuring the predetermined laser light having a maximum length of a cross-sectional form at the converging point in the direction perpendicular to the cutting line to be shorter than a maximum length in the direction parallel to the cutting line when forming the modified region at a position shallower from a laser light incident surface of the object, and the predetermined laser light having a maximum length of a cross-sectional form at the converging point in the direction perpendicular to the cutting line being longer than that at the time of forming the modified region at the shallower position when forming the modified region at a position deeper from the laser light incident surface.

8. A laser processing method according to claim 7, wherein a fracture extending along the cutting line is generated in a laser light incident surface of the object from the predetermined modified region by forming the predetermined modified region.

9. A laser processing method according to claim 7, wherein, after forming the modified region within the object, the object is cut along the cutting line from the modified region acting as a starting point region for cutting.

10. A laser processing method according to claim 7, wherein the object is provided with a semiconductor substrate, and wherein the modified region includes a molten processed region.

11. A laser processing method according to claim 7, wherein the intensity distribution of the predetermined laser light at the converging point is such that both skirt parts of a Gaussian distribution are cut off in the direction perpendicular to the cutting line.

* * * * *

UNITED STATES PATENT AND TRADEMARK OFFICE
CERTIFICATE OF CORRECTION

PATENT NO.        : 8,513,567 B2
APPLICATION NO. : 12/064275
DATED              : August 20, 2013
INVENTOR(S)        : Osajima et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1395 days.

Signed and Sealed this

Fifteenth Day of September, 2015

Michelle K. Lee
*Director of the United States Patent and Trademark Office*